(12) United States Patent
Ma et al.

(10) Patent No.: US 10,125,926 B2
(45) Date of Patent: Nov. 13, 2018

(54) LED LIGHT

(71) Applicant: Shandong Prosperous Star Optoelectronics Co., Ltd., Tai'an (CN)

(72) Inventors: Wenbo Ma, Tai'an (CN); Qiurong Liao, Tai'an (CN); Yiping Kong, Tai'an (CN); Xincheng Yuan, Tai'an (CN); Minkang Zhou, Tai'an (CN)

(73) Assignee: SHANDONG PROSPEROUS STAR OPTOELECTRONICS CO., LTD., Tai'an (CN)

( * ) Notice: Subject to any disclaimer, the term of this patent is extended or adjusted under 35 U.S.C. 154(b) by 0 days.

(21) Appl. No.: 15/399,769

(22) Filed: Jan. 6, 2017

(65) Prior Publication Data
US 2017/0191623 A1  Jul. 6, 2017

(30) Foreign Application Priority Data

Jan. 6, 2016  (CN) .......................... 2016 1 0002680

(51) Int. Cl.
| | |
|---|---|
| F21K 9/237 | (2016.01) |
| H01L 25/075 | (2006.01) |
| F21K 9/232 | (2016.01) |
| F21V 3/02 | (2006.01) |
| F21K 9/238 | (2016.01) |
| F21V 31/03 | (2006.01) |
| H01L 25/04 | (2014.01) |
| F21Y 115/10 | (2016.01) |

(52) U.S. Cl.
CPC .............. F21K 9/237 (2016.08); F21K 9/232 (2016.08); F21K 9/238 (2016.08); F21V 3/02 (2013.01); F21V 31/03 (2013.01); H01L 25/04 (2013.01); H01L 25/0753 (2013.01); *F21Y 2115/10* (2016.08)

(58) Field of Classification Search
CPC ... H01L 25/04; H01L 25/075; H01L 25/0753; F21K 9/237; F21K 9/238; F21K 9/232; F21V 31/03; F21V 3/02; F21Y 2115/10
USPC ........................ 315/66; 362/294, 373, 249.02
See application file for complete search history.

(56) References Cited

U.S. PATENT DOCUMENTS

| | | | | |
|---|---|---|---|---|
| 8,858,027 | B2 * | 10/2014 | Takeuchi | .............. F21V 23/001 362/249.02 |
| 9,653,668 | B2 * | 5/2017 | Chung | ................... H01L 33/62 |
| 2011/0181809 | A1 * | 7/2011 | Sekiguchi | ......... G02F 1/133615 349/62 |

(Continued)

*Primary Examiner* — Douglas W Owens
*Assistant Examiner* — Amy Yang
(74) *Attorney, Agent, or Firm* — Matthias Scholl, PC; Matthias Scholl

(57) ABSTRACT

An LED light including: a light-emitting bulb including a shell; a lamp holder connected to the light-emitting bulb and including external thread; a power driver disposed in the lamp holder; a stem including a wire; and a light-emitting component. The stem and the light-emitting component are disposed in the shell. One end of the stem is connected to the power driver, and the other end of the stem is connected to the light-emitting component. The light-emitting component includes at least two bar-type LED filaments. The at least two bar-type LED filaments are connected in series or in a combination of series and parallel connections. The at least two bar-type LED filaments are connected to the power driver through the wire of the stem.

8 Claims, 4 Drawing Sheets

(56) References Cited

U.S. PATENT DOCUMENTS

2013/0058080 A1* 3/2013 Ge ............................ F21V 3/00
362/231
2015/0028373 A1* 1/2015 Abe ........................ H01L 33/56
257/98

* cited by examiner

LED LIGHT

CROSS-REFERENCE TO RELATED APPLICATIONS

Pursuant to 35 U.S.C. § 119 and the Paris Convention Treaty, this application claims the benefit of Chinese Patent Application No. 201610002680.X filed Jan. 6, 2016, the contents of which are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

This invention relates to an LED light.

Description of the Related Art

The included angle between the LED filaments and the stem in conventional filament bulbs is relatively small, which means that the produced light scatters all around. As a result, as illustrated in FIG. 1, the light intensity at the bottom of the bulb shell is relatively weak and the light intensity distribution fails to meet the requirements for omnidirectional light distribution.

SUMMARY OF THE INVENTION

In view of the above-described problems, it is one objective of the invention to provide an LED light having omnidirectional light distribution.

To achieve the above objective, in accordance with one embodiment of the invention, there is provided with an LED light comprising: a light-emitting bulb comprising a shell; a lamp holder connected to the light-emitting bulb and comprising external thread; a power driver disposed in the lamp holder; a stem comprising a wire; and a light-emitting component. The stem and the light-emitting component are disposed in the shell; one end of the stem is connected to the power driver, and the other end of the stem is connected to the light-emitting component; the light-emitting component comprises at least two bar-type LED filaments; the at least two bar-type LED filaments are connected in series or in a combination of series and parallel connections; and the at least two bar-type LED filaments are connected to the power driver through the wire of the stem.

In a class of this embodiment, the at least two bar-type LED filaments each comprises a die bond substrate, an electrode, a gold bonding wire, a fluorescent colloid, and a plurality of light-emitting chips.

The plurality of light-emitting chips is attached and fixed onto a front of the die bond substrate; an anode and a cathode of each light-emitting chip are electronically connected to an anode and a cathode of the die bond substrate through the gold bonding wire, respectively; the anode and cathode of the die bond substrate are electronically connected to outer leads of the anode and the cathode of substrates disposed on the die bond substrate, respectively; one end of the electrode is connected to the outer leads of the die bond substrate through the gold bonding wire and fixed with the outer lead of the die bond substrate through the plastic cement, and the other end of the electrode is connected to the wire.

The fluorescent colloid is filled on a front and back of the die bond substrate through transparent glue, and covers the light-emitting chip; and the plurality of light-emitting chips each is purple light wafer, and the fluorescent colloid is RGB three-color fluorescent powder.

In a class of this embodiment, the die bond substrate is of conductive magnetic substance, iron, nickel, cobalt or alloy material; a surface of the die bond substrate is coated with a silver-plated or gold-plated coating; and the electrode is of conductive metal selected from iron, nickel, cobalt, copper, and alloy.

In a class of this embodiment, the at least two bar-type LED filaments each comprises a plurality of LED chips, an interlinked layer, a ceramic substrate, a welding layer, a copper layer, an insulation layer, and a heat dissipation layer which are continuously laminated in that order.

The ceramic layer is a substrate for bar-type LED filament, and a surface of the ceramic layer is plated with a circuit silver layer; the plurality of LED chips is disposed on the ceramic substrate, and the plurality of LED chips is connected through the interlinked layer; and one end of the ceramic substrate comprises an anode and a cathode comprising outer leads connected to the interlinked layer.

In a class of this embodiment, the stem comprises an exhaust pipe, a seal, a support pillar, and a magnetic connecting piece; the seal is wrapped outside the wire and connected to the shell; the exhaust pipe is disposed inside the seal; one end of the support pillar is fixed at one end of the seal, and the other end of the support pillar is bonded with the magnetic connecting piece.

The magnetic connecting piece is configured to fix the at least two bar-type LED filaments and the at least two bar-type LED filaments are connected through the magnetic connecting piece; and the magnetic connecting piece is made of conductive NdFeB magnet, Sm—Co magnet, AlNiCo magnet or ferrite magnet.

In a class of this embodiment, the electrode of the at least two bar-type LED filaments is connected to the wire by spot welding; a height of the support pillar is optional so that an included angle between the least two bar-type LED filaments and the support pillar is adjustable.

In a class of this embodiment, the included angle between the at least two bar-type LED filaments and the support pillar is between 5° and 60°.

In a class of this embodiment, the light-emitting bulb is filled with protective gases which comprise, helium, hydrogen, argon, inert gas, or a mixture thereof, and an air pressure of the protective gases is 0.2-3 atmosphere at room temperature.

In a class of this embodiment, the power driver is fixed in the lamp holder using a pouring sealant; the light-emitting bulb and the lamp holder are bonded using an adhesive; and the light-emitting bulb and the lamp holder are connected through a metal or plastic part.

In a class of this embodiment, the light-emitting bulb is an A-type bulb, G-type bulb, P-type bulb, B-type bulb, C-type bulb or T-type bulb; and the lamp holder is an E-type lamp holder, B-type lamp holder, GU-type lamp holder, GX-type lamp holder or GZ-type lamp holder.

Advantages of the LED light according to embodiments of the invention are summarized as follows. The magnetic connecting piece disposed in the stem fixes the at least two bar-type LED filaments through magnetic force and plays a conductive and fixing role. The angle between the at least two bar-type LED filaments can be adjustable by changing the height of the support pillar and the sectional area of the magnetic connecting piece, and the distribution curve of fluxes of the bar-type LED filaments are adjusted to generate LED lights with different distribution curve of fluxes. The electrode of the bar-type LED filament is connected to the wire by spot welding. The magnetic connecting piece adsorbs the die bond substrate through magnetic force to reduce the frequency of spot welding during production of the LED lights with omnidirectional light distribution and greatly improve productivity and yield rate of the LED lights.

DETAILED DESCRIPTION OF THE EMBODIMENTS

For further illustrating the invention, experiments detailing an LED light are described below. It should be noted that the following examples are intended to describe and not to limit the invention.

Figure 1:
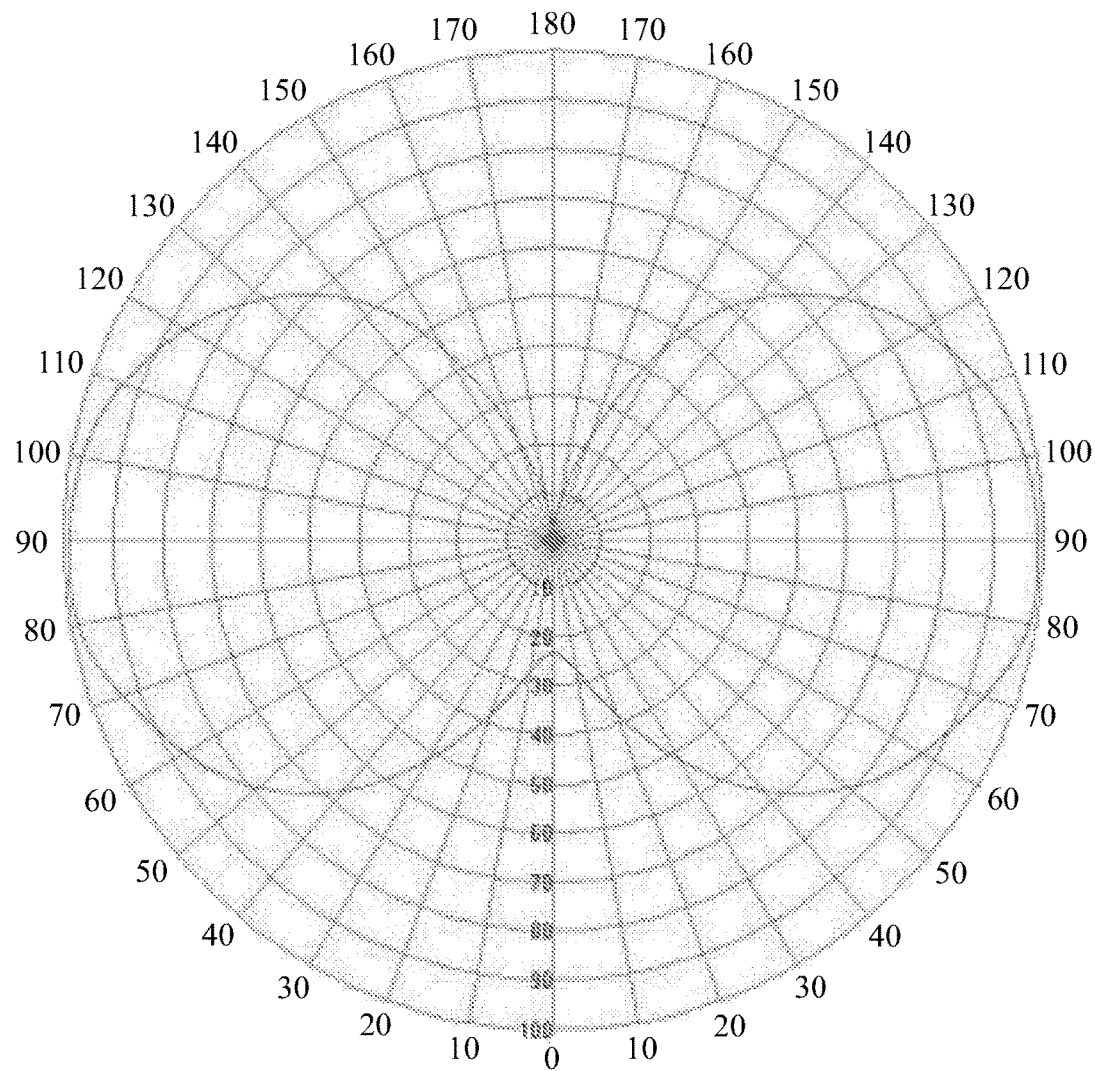
FIG. 1 is a diagram illustrating a distribution curve of fluxes of an LED filament in prior art.
Figure 2:
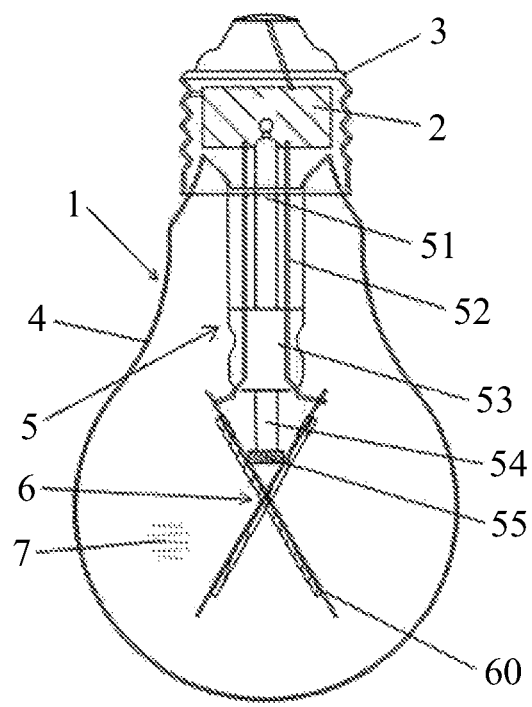
FIG. 2 is a schematic diagram of an LED light with omnidirectional light distribution according to one embodiment of the invention.

An LED light with omnidirectional light distribution is provided in the embodiment, as shown in FIG. 2, the LED light comprises a light-emitting bulb 1 and a lamp holder 3 connected to the light-emitting bulb 1.

A power driver 2 is disposed in the lamp holder 3, and the lamp holder 3 comprises external thread.

The light-emitting bulb 1 comprises a shell 4, a stem 5 disposed in the shell 4, and a light-emitting component 6. One end of the stem 5 is connected to the power driver 2, and the other end of the stem 5 is connected to the light-emitting component 6. The stem 5 comprises a wire 52.

The light-emitting component 6 comprises at least two bar-type LED filaments 60 with omnidirectional glaring. The at least two bar-type LED filaments 60 are connected in series connection or in series-parallel connection. The at least two bar-type LED filaments 60 are connected to the power driver 2 through the stem wire 52.

Figure 3:
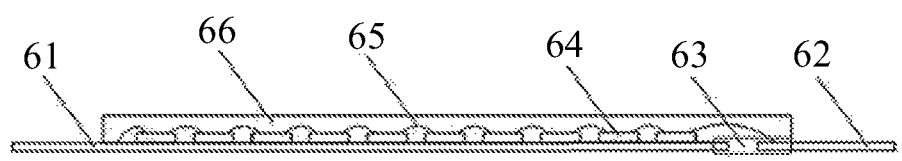
FIG. 3 is a schematic diagram of a bar-type LED filament according to one embodiment of the invention.

In this embodiment, as shown in FIG. 3, the at least two bar-type LED filaments 60 comprise a die bond substrate 61, an electrode 62, a gold bonding wire 65, a fluorescent colloid 66 and a plurality of light-emitting chips 64.

The plurality of light-emitting chip 64 is attached and fixed onto the front of the die bond substrate 61. The anode and the cathode of the light-emitting chip 64 are directly or indirectly connected to the anode and the cathode of the die bond substrate 61 through the gold bonding wire 65. The anode and cathode are respectively connected to outer leads of the anode and the cathode of the substrates 61 disposed on the die bond substrate.

One end of the electrode 62 is connected to outer leads of the die bond substrate 61 through the gold bonding wire 65 and fixed with the outer lead of the die bond substrate 61 through the plastic cement 63. The other end of the electrode 62 is connected to the wire 52.

The fluorescent colloid 66 is filled on the front and back of the die bond substrate 60 through the transparent glue (epoxy glue or silicon glue), and covers the light-emitting chip 64.

The light-emitting chip 64 is a purple light wafer, and the fluorescent colloid is RGB three-color fluorescent powder to make LED filament a white light LED source.

The at least two bar-type LED filaments 60 have an integrated package structure which changes the traditional way that die bond is mounted on the metal support. By mounting the die bond on the transparent die bond substrate, the fluorescent colloid 66 is coated on the front and back sides of the die bond substrate (the front side is die bond side, while the back side is non-die bond plane opposite to the front side). This has radically improved the glaring efficiency of LED light source. It is more outstanding for the white light LED source.

The light-emitting chip 64 is a transparent body. After being electrified, the light-emitting chip 64 emits the natural light from six sides. Some light directly penetrates through the transparent die bond substrate 61 and then radiates on the fluorescent colloid 66 at the back of the die bond substrate. Other light directly radiates the surface of the light-emitting chip 64 to have the natural light of the light-emitting chip 64 transferred into the white light.

The die bond substrate 61 is of conductive magnetic substance, iron, nickel, cobalt or alloy material.

The surface of the die bond substrate 61 is coated with a silver-plated or gold-plated coating. The surface of the electrode 62 is of conductive metal such as iron, nickel, cobalt, copper or alloy.

Figure 4:
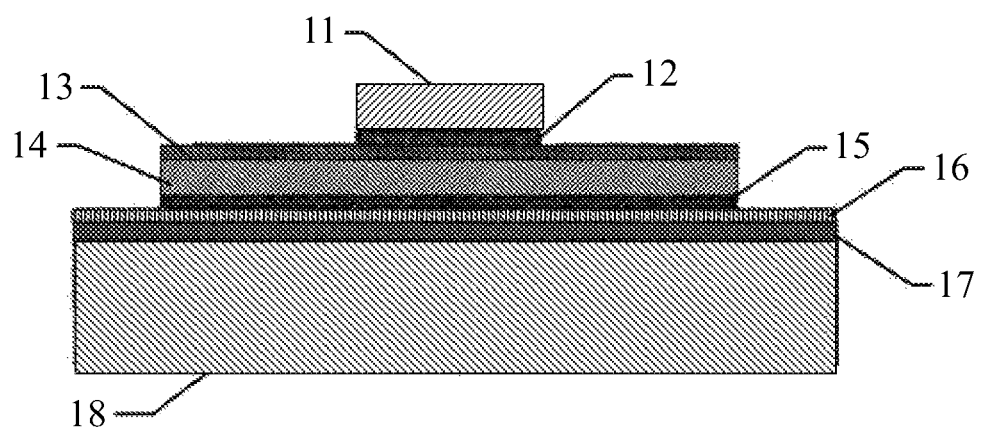
FIG. 4 is a schematic diagram of a bar-type LED filament according to another embodiment of the invention.

In this embodiment, the at least two bar-type LED filaments 60 further comprise another mode of execution. As shown in FIG. 4, the at least two bar-type LED filaments comprise continuously laminated LED chips 11, an interlinked layer 12, a ceramic substrate 14, a welding layer 15, a copper layer 16, an insulation layer 17 and a heat dissipation layer 18.

The ceramic layer 14 is a substrate for bar-type LED filament, and the surface of the ceramic layer 14 is plated with a circuit silver layer 13. The plurality of LED chips 11 is disposed on the ceramic substrate 14, and the LED chips 11 are connected through the interlinked layer 12. The end of the ceramic substrate 14 comprises outer leads of the anode and cathode connected to the interlinked layer 12. The outer leads of the anode and the cathode are connected to the power driver 2 through the wire 52.

In the structure of this embodiment, the copper layer 16 and the heat dissipation layer 18 play a role of heat dissipation to make the at least two bar-type LED filaments 60 obtain good heat dissipation performance After the test, the at least two bar-type LED filaments 60 can keep on operating for 2,500 hours under 55° C. as a constant temperature. Under 70° C. as a constant temperature, it can keep on operating for 1,000 hours, which improves the service life of the LED light with omnidirectional light distribution.

In this embodiment, the stem 5 comprises an exhaust pipe 51, a seal 53, a support pillar 54 and a magnetic connecting piece 55.

The seal 53 is wrapped outside the wire 52, and the seal 53 is connected to the shell 4. The exhaust pipe 51 is disposed inside the seal 53, and the exhaust pipe 51 has the internal part of light-emitting bulb connected to the external part. After the sealing process of the light-emitting bulb 1 is completed, the end of the exhaust pipe 51 is welded for sealing.

One end of the support pillar 54 is fixed at the end of the seal 53, and the other end of the support pillar 54 is bonded with the magnetic connecting piece 55. The magnetic connecting piece 55 is used to fix the at least two bar-type LED filaments and have the at least two bar-type LED filaments connected through the magnetic connecting piece 55. The magnetic connecting piece 55 is made of conductive NdFeB magnet, Sm—Co magnet, AlNiCo magnet or ferrite magnet. This has improved the electrical conductivity of the magnetic connecting piece 55 and enhanced the service life of the LED light with omnidirectional light distribution.

In this embodiment, the electrode 62 of the bar-type LED filament is connected to the wire 52 by spot welding. The magnetic connecting piece 55 adsorbs the die bond substrate 61 through magnetic force. In the LED light with omnidirectional light distribution, the angle between the at least two bar-type LED filaments is adjusted by changing the set height of the support pillar 54 and the sectional area of the magnetic connecting piece 55, and the distribution curve of fluxes of the at least two bar-type LED filaments are adjusted.

The included angle between the at least two bar-type LED filaments 60 and the support pillar 54 is between 5° and 60°. The range of the preferred included angle is between 15° and 50°, and the preferred included angles are 25°, 27°, 35°, 45°, 50° and 55°. The included angle between the at least two bar-type LED filaments 60 and the support pillar 54 is between 25° and 27°. The light source emitting from the LED light with omnidirectional light distribution is relatively concentrated and applicable to being used in the site where the light is relatively concentrated or at some positions in need of concentrated radiation. However, it does not necessary require very concentrated radiation, and the included angle is between 25° and 27°. As for the non-concentrated radiation area, it can play a role of radiation, and there will be no distinct difference for light brightness in the area.

When the included angle is 35° and 45°, the light emitting from the LED light with omnidirectional light distribution is relatively uniform. When the included angle is 50° and 55°, the light emitting from the LED light with omnidirectional light distribution is relatively wide, and it is suitable for being used to radiate a large scope and can ensure uniform light distribution.

In this embodiment, the light-emitting bulb 1 is filled with heat dissipation and protective gases 7 which comprise, helium, hydrogen, argon, inert gas with low-viscosity and high thermal conductivity as well as a mixture thereof. The air pressure of the heat dissipation and protective gases 7 is 0.2-3 atmosphere at room temperature.

In this embodiment, the power driver 2 is fixed in the lamp holder 3 with pouring sealant. The light-emitting bulb 1 and the lamp holder 3 are bonded with adhesive. The light-emitting bulb 1 and the lamp holder 3 are connected through metal part or plastic part. Thus, the lamp holder 3 can hold the power driver 2 with a relatively large volume.

In this embodiment, the light-emitting bulb 1 includes an A-type bulb, G-type bulb, P-type bulb, B-type bulb, C-type bulb or T-type bulb.

The lamp holder 3 includes an E-type lamp holder, B-type lamp holder, GU-type lamp holder, GX-type lamp holder or GZ-type lamp holder.

Figure 5:
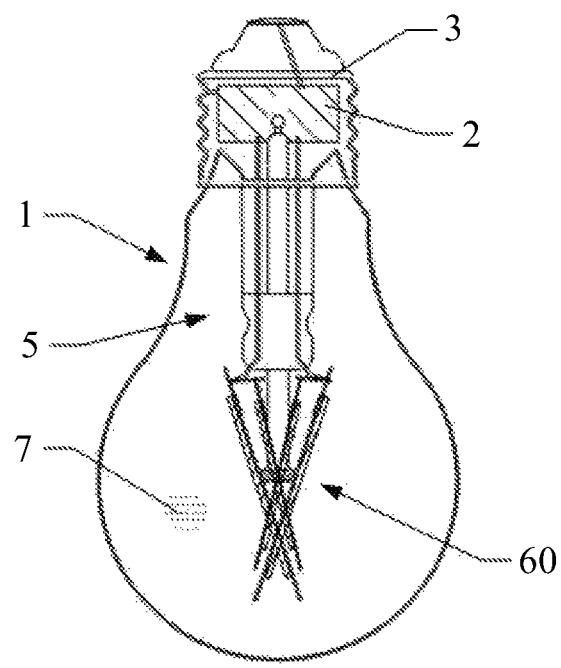
FIG. 5 is a schematic diagram of an LED light with omnidirectional light distribution according to another embodiment of the invention.
Figure 6:
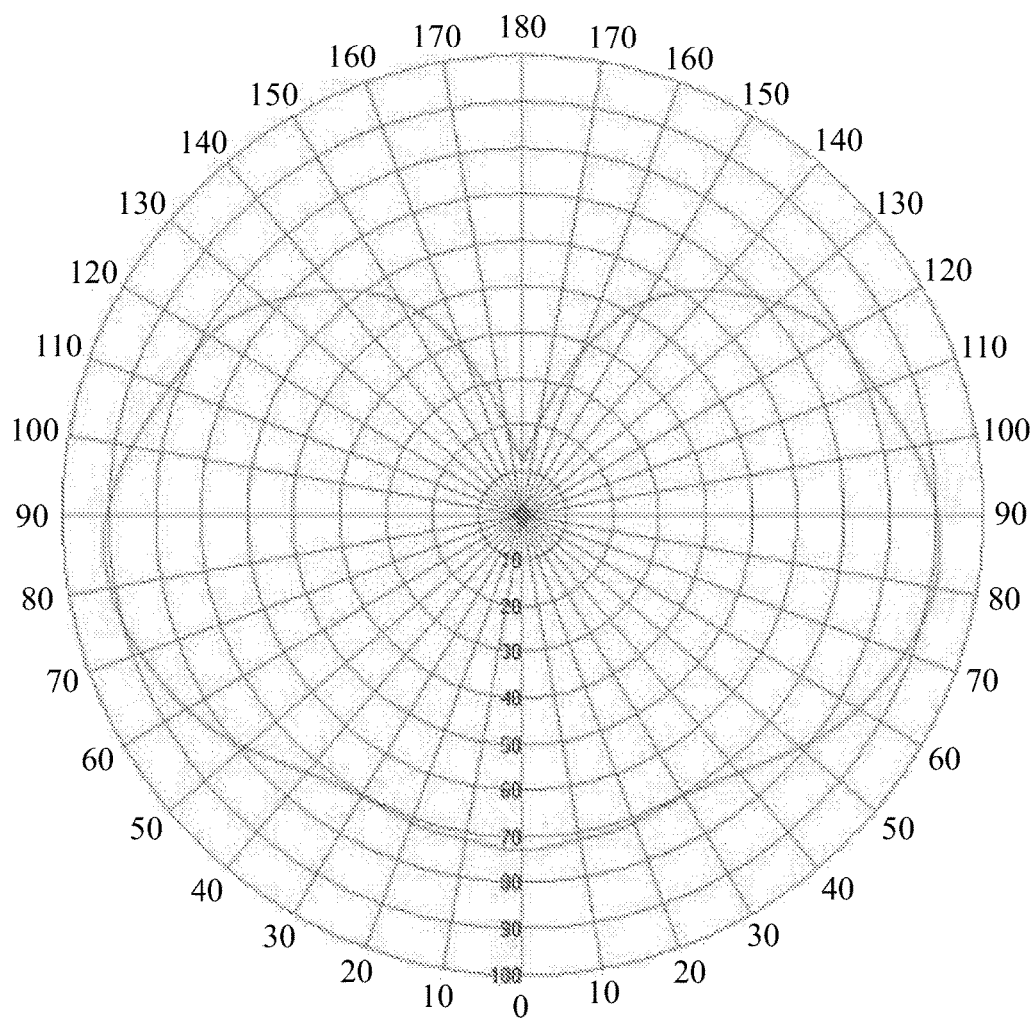
FIG. 6 is diagram illustrating a distribution curve of fluxes of an LED light with omnidirectional light distribution according to one embodiment of the invention.

As shown in FIG. 5 and FIG. 6, the light-emitting bulb 1 is an A60 bulb, and the lamp holder 3 is an E27 lamp holder.

The power driver 2 is fixed in the lamp holder 3 with pouring sealant. The light-emitting bulb 1 and the lamp holder 3 are bonded with an adhesive. The light-emitting bulb 1 and the lamp holder 3 are connected through a metal part or plastic part. Thus, the lamp holder 3 can hold the power driver 2 with a relatively large volume.

The light-emitting component 6 is composed of four LED filaments 60. The four LED filaments are connected in series by two filaments and then connected in parallel. The two filaments in series connection in the same branch circuit are symmetrically distributed in space. Thus, the light emitting from the light-emitting component 6 is uniform. The included angle between the at least two bar-type LED filaments 60 and the support pillar 54 is 27°. The distribution curve of fluxes for omnidirectional light distribution can be obtained in FIG. 6.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. An LED light, comprising:
   a light-emitting bulb comprising a shell;
   a lamp holder connected to the light-emitting bulb and comprising external thread;
   a power driver disposed in the lamp holder;
   a stem comprising a wire; and
   a light-emitting component; wherein:
   the stem and the light-emitting component are disposed in the shell;
   one end of the stem is connected to the power driver, and the other end of the stem is connected to the light-emitting component;
   the light-emitting component comprises at least two bar-type LED filaments; the at least two bar-type LED filaments are connected in series or in a combination of series and parallel connections; and the at least two bar-type LED filaments are connected to the power driver through the wire of the stem;
   the at least two bar-type LED filaments each comprises a die bond substrate, an electrode, a gold bonding wire, a fluorescent colloid, and a plurality of light-emitting chips;
   the plurality of light-emitting chips is attached and fixed onto a front of the die bond substrate;
   an anode and a cathode of each light-emitting chip are electronically connected to an anode and a cathode of the die bond substrate through the gold bonding wire, respectively; the anode and cathode of the die bond substrate are electronically connected to outer leads of the anode and the cathode of substrates disposed on the die bond substrate, respectively;
   one end of the electrode is connected to the outer leads of the die bond substrate through the gold bonding wire and fixed with the outer lead of the die bond substrate through a plastic cement, and the other end of the electrode is connected to the wire;
   the fluorescent colloid is filled on a front and back of the die bond substrate through transparent glue, and covers the light-emitting chip;
   the plurality of light-emitting chips each is purple light wafer, and the fluorescent colloid is RGB three-color fluorescent powder;
   the stem comprises an exhaust pipe, a seal, a support pillar, and a magnetic connecting piece;

the wire extends through the seal, and the seal is wrapped outside the wire and connected to the shell;

the exhaust pipe is disposed inside the seal;

one end of the support pillar is fixed at one end of the seal, and the other end of the support pillar is bonded with the magnetic connecting piece;

the magnetic connecting piece is configured to fix the at least two bar-type LED filaments and the at least two bar-type LED filaments are connected through the magnetic connecting piece; and the magnetic connecting piece is made of conductive NdFeB magnet, Sm-Co magnet, AlNiCo magnet or ferrite magnet.

2. The LED light of claim 1, wherein:

the die bond substrate is of conductive magnetic substance, iron, nickel, cobalt or alloy material;

a surface of the die bond substrate is coated with a silver-plated or gold-plated coating; and the electrode is of conductive metal selected from iron, nickel, cobalt, copper, and alloy.

3. The LED light of claim 1, wherein:

the at least two bar-type LED filaments each comprises a plurality of LED chips, an interlinked layer, a ceramic substrate, a welding layer, a copper layer, an insulation layer, and a heat dissipation layer which are continuously laminated in that order;

the ceramic layer is a substrate for bar-type LED filament, and a surface of the ceramic layer is plated with a circuit silver layer;

the plurality of LED chips is disposed on the ceramic substrate, and the plurality of LED chips is connected through the interlinked layer; and one end of the ceramic substrate comprises an anode and a cathode comprising outer leads connected to the interlinked layer.

4. The LED light of claim 1, wherein the electrode of the at least two bar-type LED filaments is connected to the wire by spot welding; a height of the support pillar is optional so that an included angle between the least two bar-type LED filaments and the support pillar is adjustable.

5. The LED light of claim 4, wherein the included angle between the at least two bar-type LED filaments and the support pillar is between 5° and 60°.

6. The LED light of claim 1, wherein the light-emitting bulb is filled with protective gases which comprise, helium, hydrogen, argon, inert gas, or a mixture thereof, and an air pressure of the protective gases is 0.2-3 atmosphere at room temperature.

7. The LED light of claim 1 wherein the power driver is fixed in the lamp holder using a pouring sealant; the light-emitting bulb and the lamp holder are bonded using an adhesive; and the light-emitting bulb and the lamp holder are connected through a metal or plastic part.

8. The LED light of, claim 1 wherein the light-emitting bulb is an A-type bulb, G-type bulb, P-type bulb, B-type bulb, C-type bulb or T-type bulb; and the lamp holder is an E-type lamp holder, B-type lamp holder, GU-type lamp holder, GX-type lamp holder or GZ-type lamp holder.

* * * * *